United States Patent
Li et al.

(10) Patent No.: US 9,399,817 B2
(45) Date of Patent: Jul. 26, 2016

(54) MAGNETRON SOURCE, MAGNETRON SPUTTERING APPARATUS AND MAGNETRON SPUTTERING METHOD

(75) Inventors: Yangchao Li, Beijing (CN); Bo Geng, Beijing (CN); Xuewei Wu, Beijing (CN); Guoqing Qiu, Beijing (CN); Xu Liu, Beijing (CN)

(73) Assignee: Beijing NMC Co., Ltd., Beijing (CN)

( * ) Notice: Subject to any disclaimer, the term of this patent is extended or adjusted under 35 U.S.C. 154(b) by 575 days.

(21) Appl. No.: 13/977,314

(22) PCT Filed: Sep. 30, 2011

(86) PCT No.: PCT/CN2011/080418
§ 371 (c)(1),
(2), (4) Date: Jun. 28, 2013

(87) PCT Pub. No.: WO2012/088936
PCT Pub. Date: Jul. 5, 2012

(65) Prior Publication Data
US 2013/0277205 A1     Oct. 24, 2013

(30) Foreign Application Priority Data

Dec. 29, 2010   (CN) .......................... 2010 1 0613102

(51) Int. Cl.
*C23C 14/35* (2006.01)
*H01J 37/34* (2006.01)

(52) U.S. Cl.
CPC ............... *C23C 14/35* (2013.01); *H01J 37/347* (2013.01); *H01J 37/3408* (2013.01); *H01J 37/3455* (2013.01)

(58) Field of Classification Search
CPC . H01J 37/3455; H01J 37/347; H01J 37/3408; C23C 14/35

USPC .......................... 204/192.12, 298.2
See application file for complete search history.

(56) References Cited

U.S. PATENT DOCUMENTS 4,995,958 A   2/1991 Anderson et al.
5,944,968 A   8/1999 Kobayashi et al.

FOREIGN PATENT DOCUMENTS

CN   101878321   11/2010
JP   62-211375   9/1987

OTHER PUBLICATIONS

International Search Report of PCT/CN2011/080418; publication date: Jul. 5, 2012 as WO2012/088936.

*Primary Examiner* — Rodney McDonald
(74) *Attorney, Agent, or Firm* — Locke Lord LLP; Howard M. Gitten (57) ABSTRACT

Provided is a magnetron source, which comprises a target material, a magnetron located thereabove and a scanning mechanism connected to the magnetron for controlling the movement of the magnetron above the target material. The scanning mechanism comprises a peach-shaped track, with the magnetron movably disposed thereon; a first driving shaft, with the bottom end thereof connected with the origin of the polar coordinates of the peach-shaped track, for driving the peach-shaped track to rotate about the axis of the first driving shaft; a first driver connected to the first driving shaft for driving the first driving shaft to rotate; and a second driver for driving the magnetron to move along the peach-shaped track via a transmission assembly. A magnetron sputtering device including the magnetron and a method for magnetron sputtering using the magnetron sputtering device are also provided.

20 Claims, 6 Drawing Sheets

FIG. 10 distance from the center of the target material ( Inch )

FIG. 11

MAGNETRON SOURCE, MAGNETRON SPUTTERING APPARATUS AND MAGNETRON SPUTTERING METHOD

CROSS-REFERENCE TO RELATED APPLICATIONS

This application is the national phase under 35 U.S.C. §371 of PCT International Application No. PCT/CN2011/080418 filed Sep. 30, 2011, which claims the benefit of China Patent Application No. 2010-10613102.2 filed Dec. 29, 2010, the entire contents of the aforementioned applications are hereby incorporated herein by reference.

FIELD OF THE INVENTION

The present invention relates to semiconductor technology, and in particular, relates to a magnetron source, a magnetron sputtering apparatus including the magnetron source, and a magnetron sputtering method.

BACKGROUND OF THE INVENTION

Magnetron sputtering, which is also called physical vapour deposition, is a method which widely used for depositing metal layers and relevant materials during manufacturing integrated circuits.

Figure 8:
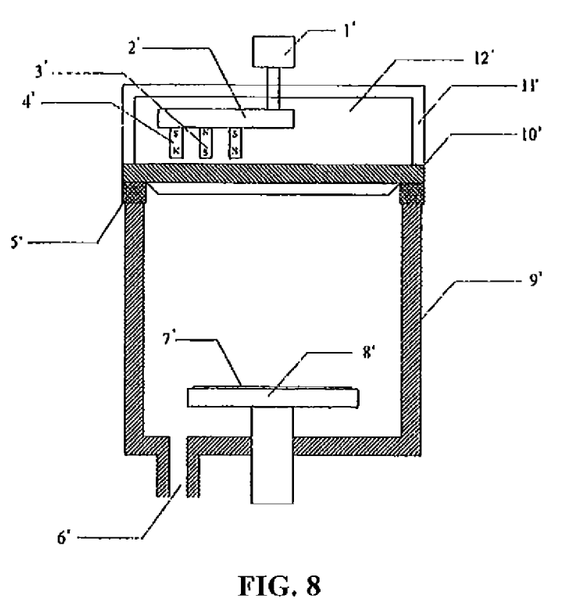
FIG. 8 is a schematic diagram of a present magnetron sputtering apparatus.

FIG. 8 shows a typical magnetron sputtering apparatus, wherein a high vacuum process chamber is defined inside a chamber body 9', a target material 10' to be sputtered is provided on the top of the chamber body 9', a top lid 11' is provided above the target material 10', deionized water 12' is full filled between the top lid 11' and the target material 10', an electrostatic chuck which is used for holding a wafer 7' is provided in the high vacuum process chamber, a pumping chamber is communicated with the bottom of the high vacuum process chamber.

In order to improve sputtering efficiency, magnetron 2' is placed on the rear of the target material 10', and includes magnets 3' and 4' with opposite polarities, and generates magnetic field in the portion of the chamber adjacent to the magnets 3' and 4' under the limitation of the track. For the self-ionized plasma (SIP) sputtering, the magnetron 2' is small, and is a nested structure, wherein an inner track is consisted of one or more magnets and is surrounded by an outer track, the outer track is formed by a magnet which polarity is opposite to that of the magnet for forming the inner track. The magnetic field limits electrons so as to limit the motion range thereof, and extends the motion trajectory of the electrons, such that the atoms may be ionized to the greatest degree to form ions so as to significantly increase the ion concentration, and then a high density plasma region is formed in the portion of the chamber adjacent to the magnetron 2'. In order to achieve the object of uniformly sputtering, the magnetron 2' is driven by the motor 1' to move along a fixed trajectory around the center of the target material 10' (which is also called scanning).

Figure 9:
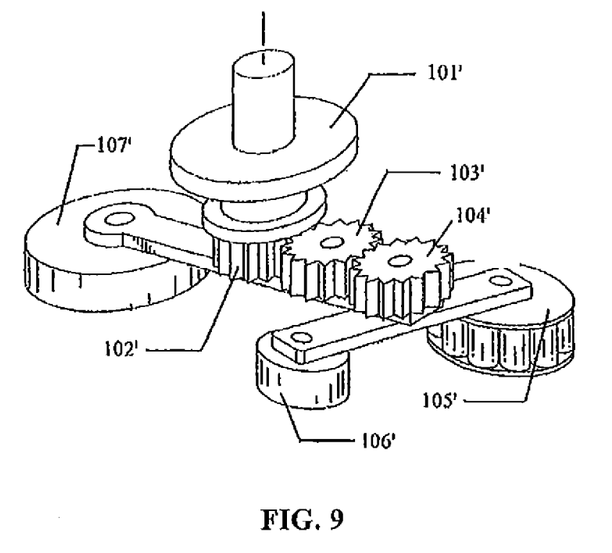
FIG. 9 is a schematic diagram of a present driving mechanism.
Figure 10:
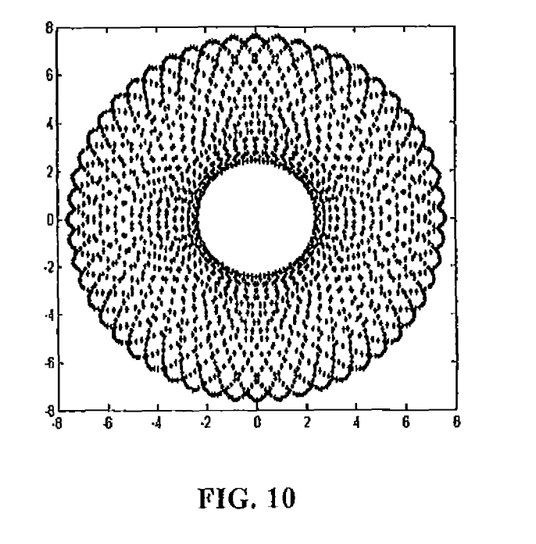
FIG. 10 is a motion trajectory of the magnetron which is controlled by using the scanning mechanism in FIG. 9.
Figure 11:
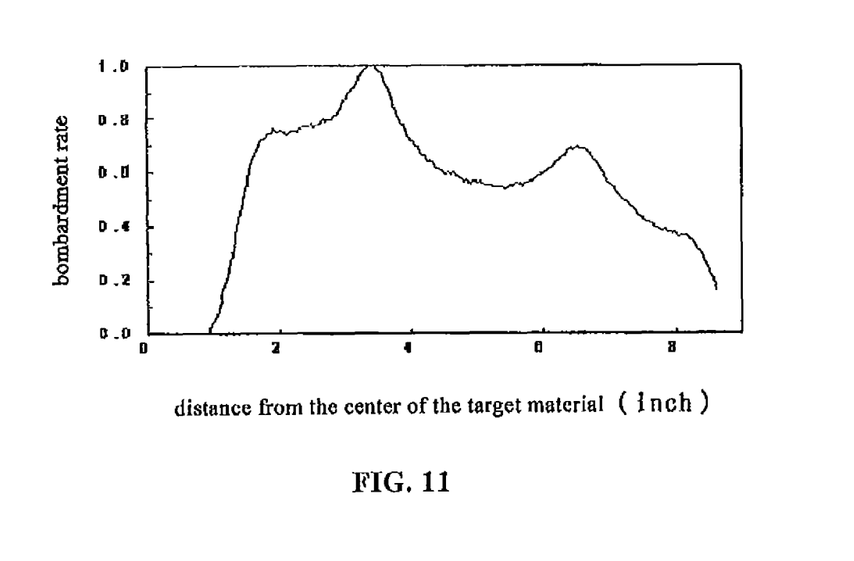
FIG. 11 is a curve of a target bombardment in the prior art.

FIG. 9 shows a driving mechanism of a magnetron in the prior art, wherein, through a shaft 101', a motor drives a gear 103' to rotate around a gear 102', the gear 103' drives a gear 104', and the gear 104' drives a magnetron 105' and a bob-weight 106' to rotate, in addition, the magnetron 105' and the bob-weight 106' revolve around the shaft 101', a bob-weight 107' is used to balance the overall driving mechanism to prevent imbalance caused by torque, so as to increase the stability of transmission. The motion trajectory of the magnetron 105' during it scans through the surface of the target material is shown in FIG. 10, a bombardment graph of the target material obtained by emulating is shown in FIG. 11, wherein the utilization ratio of the target material is about 53%, and the utilization ratio of the target material near the center thereof and at periphery thereof is low.

In summary, in the prior art, it is difficult to control the movement speed of the magnetron driven by above driving mechanism when the magnetron scans different portions of the target material, and the utilization ratio of the target material is expected to be improved.

SUMMARY OF THE INVENTION

The present invention is directed to solve at least one of problems in the prior art.

Therefore, an object of the invention is to provide a magnetron source, which may be used to adjust the movement speed of scanning the periphery and the center of the target material by the magnetron.

Another object of the invention is to provide a magnetron sputtering apparatus with above said magnetron source.

Still another object of the invention is to provide a magnetron sputtering method using above said magnetron sputtering apparatus.

In order to achieve above objects, a magnetron source in an embodiment according to the first aspect of the invention comprises: a target material; a magnetron located above the target material; and a scanning mechanism connected to the magnetron for controlling the movement of the magnetron above the target material. The scanning mechanism comprises: a peach-shaped track, on which the magnetron is movably disposed; a first driving shaft, the bottom end of which is connected with the origin of polar coordinates of the peach-shaped track, the said first driving shaft drives the peach-shaped track to rotate around the axis of the first driving shaft; a first driver connected with the first driving shaft, for driving the first driving shaft to rotate; and a second driver for driving the magnetron to move along the peach-shaped track via a transmission assembly.

According to the magnetron source in above embodiment, on one hand, the first driver drives the peach-shaped track to rotate around the axis of the first driving shaft via the first driving shaft (i.e., causing the peach-shaped track 14 and the magnetron 12 provide thereon to rotate above the target material together), and the second driver drives the magnetron to move along the peach-shaped track via a transmission assembly, the motion trajectory of the magnetron on the surface of the target material is formed by superimposing the rotation of the peach-shaped track and movement of the magnetron along the peach-shaped track, such that the motion trajectory of the magnetron is ensured to cover the entire target material. On the other hand, the second driver may control the movement speed of the magnetron along the peach-shaped track independent of the first driver, so as to adjust the scanning time of the magnetron at the periphery and center of the target material. Therefore, the magnetron source according to above embodiment of the invention may improve the utilization ratio of the target material and achieve ideal bombardment effect of the target material, and obtain high metal ionization rate, so that a ideal sputtering effect may be obtained in sputtering process.

Furthermore, the magnetron according to above embodiment of the invention, comprises following additional technical features:

According to an embodiment of the invention, the transmission assembly comprises: a first transmission gear connected with the second driver and driven by the second driver;

a hollow shaft and a second transmission gear, the said hollow shaft is rotatably nested on the first driving shaft, and the second transmission gear is mounted on the hollow shaft and engaged with the first gear; a star gear mounted on the hollow shaft: a planet shaft and a planet gear, the planet gear is mounted on the planet shaft and engaged with the planet gear to drive the planet shaft to rotate; a retractable link rod, one end thereof is connected to the planet shaft and the other end thereof is connected to the magnetron for driving the magnetron to move along the peach-shaped track; and a star rack, one end thereof is fixed to the first driving shaft and the planet shaft is rotatably mounted to the other end thereof.

According to an embodiment of the invention, the retractable link rod comprises: an inner rod, one end thereof is connected to the planet shaft; and an outer rod, one end thereof is connected to the magnetron and the other end thereof is connected to the inner rod via a retractable member.

According to an embodiment of the invention, an axial hole is provided on the other end of the inner rod, the other end of the outer rod is inserted into the axial hole, the retractable member is a spring provided in the axial hole so that the other end of the outer rod is connected to the inner rod via the spring.

According to an embodiment of the invention, the axis of the first driving shaft passes through the center of the target material.

According to an embodiment of the invention, when the magnetron is located on the tip of the peach-shaped track, the projection on the level surface of the outmost edge of the magnetron and that of the periphery of the target material are consistent.

According to an embodiment of the invention, the peach-shaped track is symmetrical with respect to X axis and portions of the peach-shaped track above the X axis are defined by following equation:

$$r = a \times \theta + b$$

wherein the r is a distance from a point on the peach-shaped track to the origin of polar coordinates of the peach-shaped track, $\theta$ is a angle between the line segment connecting the points on the peach-shaped track to the origin of polar coordinates of the peach-shaped track and the forward direction of the X axis and $0 \leq \theta \leq \pi$, and both a and b are constants which are greater than zero.

According to an embodiment of the invention, the first driver and the second driver are motors.

A magnetron sputtering apparatus according to the embodiment of the second aspect of the invention comprises: a chamber body in which a chamber is defined; and a magnetron source according to the embodiment of the first aspect of the invention, wherein a target material of the magnetron source is provided on upper end of the chamber body and the lower surface of the target material is exposed into the chamber.

A magnetron sputtering method according to the embodiment of the third aspect of the invention using the magnetron sputtering apparatus according to the embodiment of the second aspect of the invention, comprises: controlling the peach-shaped track of the magnetron sputtering apparatus to rotate, and controlling the magnetron to move along the peach-shaped track so as to bombard the target material.

According to an embodiment of the invention, in one period in which the magnetron runs a circle along the peach-shaped track from the tip end of the peach-shaped track, the magnetron accelerates along the peach-shaped track in the first half period, and decelerates along the peach-shaped track in the second half period.

According to an embodiment of the invention, the angular acceleration when the magnetron accelerates is $6.28 \times 10^{-4}$ rad/s$^2$, and the angular acceleration when the magnetron decelerates is $-6.28 \times 10^{-4}$ rad/s$^2$.

According to an embodiment of the invention, in one period in which the magnetron runs a circle along the peach-shaped track starting from the tip end of the peach-shaped track, the magnetron performs in turn a first accelerated motion, a first uniform motion, a second accelerated motion, a first decelerated motion, a second uniform motion, and a second decelerated motion.

According to an embodiment of the invention, the running times of the first accelerated motion, the first uniform motion, the second accelerated motion, the first decelerated motion, the second uniform motion, and the second decelerated motion are equal to each other.

According to an embodiment of the invention, the angular accelerations of the magnetron in the first accelerated motion and the second accelerated motion are $6.28 \times 10^{-4}$ rad/s$^2$, and the angular accelerations of the magnetron in the first decelerated motion and the second decelerated motion are $-6.28 \times 10^{-4}$ rad/s$^2$.

Additional aspect and advantageous of the invention will be described in following description, and parts of which will become apparent from following description, or will be known through practice of the invention.

BRIEF DESCRIPTION OF THE DRAWINGS

Above and/or additional aspect and advantageous of the invention will become apparent and easy to understand by describing the embodiments in combination with following drawings.

DETAILED DESCRIPTION OF EMBODIMENTS

The invention will now be described more fully hereinafter with reference to the accompanying drawings, in which exemplary embodiments of the invention are shown. The same or similar reference numerals are used to denote the same or similar component, or those with same or similar functions throughout the specification. The embodiments described with reference to the accompanying drawings are Just exemplary, for explaining the invention, and should not be construed as limited to the invention.

It should be appreciated that the relationships of orientations or positions denoted by the terms of "longitude", "transverse", "up", "down", "front", "back", "right", "left", "vertical", "horizontal", "top", "bottom", "inside", and "outside" used herein refer to those illustrated in the accompany drawings, which are only for conveniently describing the invention and simplifying the description, rather than indicate or imply that a device or member has to be in a specific orientation or configured or operated in a specific orientation.

In addition, the terms of "first" and "second" are for the purpose of describing only and should not be constructed to indicate or imply the relative importance.

Figure 1:
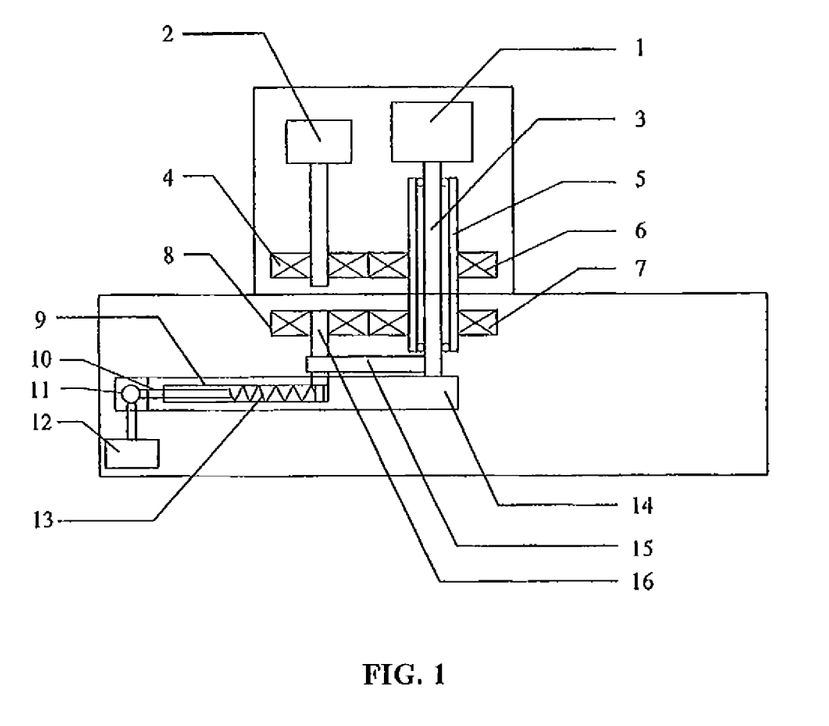
FIG. 1 is a schematic diagram showing the magnetron source according to an embodiment of the invention.
Figure 2:
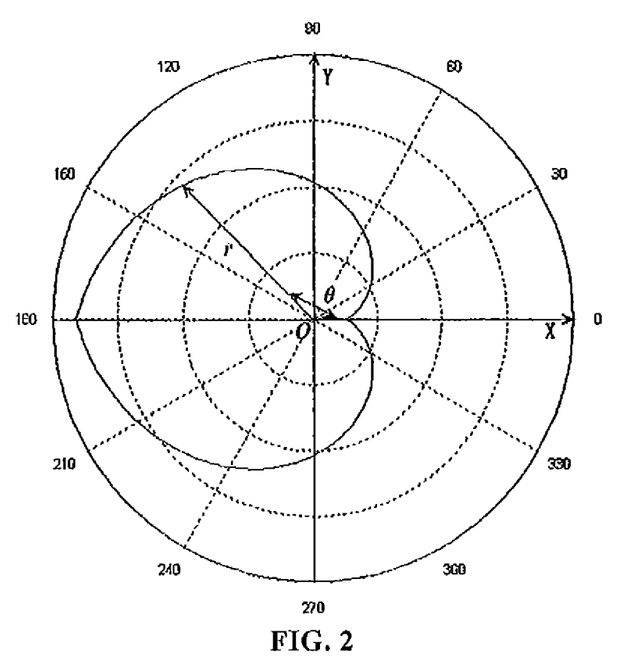
FIG. 2 is a cross-section schematic diagram along line A-A in FIG. 1.

Here, the terms of "mount", "connect", and "link" should be understood broadly, unless otherwise specified and defined, for example, they may be mechanical connection or electrical connection, and also inner communication between two members, they may direct connection, and also indirect connection via a medium, the skilled persons in the art may understand the meanings of above terms according to specific situations, Hereinafter, a magnetron source according to the embodiment of the invention will be described with reference to FIGS. 1 and 2.

As shown in the figures, the magnetron source comprises a target material (not shown), a magnetron 12, and a scanning mechanism. Specifically, the magnetron 12 is located above the target material. The scanning mechanism is connected to the magnetron 12 such that the magnetron 12 may move above the target material.

Wherein, the scanning mechanism has a peach-shaped track 14, a first driving shaft 3, a first driver 1 and a second driver 2. Specifically, the magnetron 12 is movably provided on the peach-shaped track 14. The bottom end of the driving shaft 3 is connected to the origin of polar coordinates of the peach-shaped track 14 (the origin O in FIG. 2), The bottom end of the first driving shaft 3 is used to drive the peach-shaped track 14 to rotate around the axis of the first driving shaft 3. The first driver 1 is connected to the first driving shaft 3, for driving the first driving shaft 3 to rotate. The second driver 2 drives the magnetron 12 to move along the peach-shaped track 14 via a transmission assembly. Optionally, the first driver 1 and the second driver 2 are motors.

The magnetron source according to the embodiment of the invention, on one hand, the motion trajectory of the magnetron 12 substantially covers the entire surface of the target material, specifically, the peach-shaped track 14 is driven by the first driver 1 via the first driving shaft 3 to rotate around the axis of the first driving shaft 3 (i.e., causing the peach-shaped track 14 and the magnetron 12 provided thereon to rotate above the target material together), and the magnetron 12 is driven by the second driver 2 via the transmission assembly to move along the peach-shaped track 14. It can be seen that the motion trajectory of the magnetron 12 on surface of the target material is formed by superimposing the rotation of the peach-shaped track 14 and the movement of the magnetron 12 along the peach-shaped track 14, the motion trajectory of the magnetron 12 may cover the surface of the target material through such superimposing. On the other hand, in the magnetron source according to the embodiment of the invention, the scanning time when the magnetron 12 scans the edge and center of the target material may be adjusted, specifically, the speed of the peach-shaped track 14 rotating around the axis of the driving shaft 3 and the speed of the magnetron 12 moving along the peach-shaped track 14 may be controlled independently from each other through the first driver 1 and the second driver 2, respectively, such that the scanning time when the magnetron 12 scans the edge and center of the target material may be adjusted by adjusting the first driver 1 and/or the second driver 2 as needed. Accordingly, in the magnetron source according to the embodiment of the invention, the motion trajectory of the magnetron 12 and the scanning time when the magnetron 12 scans different positions may be controlled by using above means, such that the utilization ratio of the target material may be increased, an ideal bombardment effect of the target material may be realized, and the metal ionization rate may be higher, furthermore, an ideal sputtering effect in the sputtering process may be obtained.

According Loan embodiment of the invention, the transmission assembly comprises: a first transmission gear 4, a hollow shaft 5 and a second transmission gear 6, a star gear 7, a planet shaft 16 and a planet gear 8, a retractable link rod and a star rack 15.

Specifically, the first transmission gear 4 is connected to the second driver 2 and driven by the same. The hollow shaft 5 is rotatably nested outside the first driving shaft 3, and the second transmission gear 6 is mounted on the hollow shaft 5 and engaged with the first transmission gear 4. The star gear 7 is mounted on the hollow shaft 5. The planet gear 8 is mounted on the planet shaft 16 and engaged with the planet gear 7 to drive the planet shaft 16 to rotate. One end of the retractable link rod is connected to the planet shaft 16 and the other end thereof is connected to the magnetron 12 for driving the magnetron 12 to move along the peach-shaped track 14. One end of the star rack 15 is fixed to the first driving shaft 13 and the planet shaft 16 is rotatably mounted to the other end thereof. The manner for connecting the magnetron 12 with the retractable link rod is not specified defined. For example, as shown in FIG. 1, the magnetron 12 may be connected to the end of the retractable link rod via a mounting shaft 11.

Hereinafter, a scanning process performed by the magnetron source according to the above embodiment of the invention will be described with reference to FIGS. 1 and 2.

First of all, the movement of the peach-shaped track 14 will be described. As shown in the figures, the driving shaft 3 is driven to rotate by the first driver 1, which further drives the peach-shaped track 14 mounted to the bottom end of the first driving shaft 3 to rotate around the axle center of the first driving shaft 3 (the axle centre is also the origin of polar coordinates of the peach-shaped track 14), so that the motion trajectory of the peach-shaped track 14 may cover the entire surface of the target material.

Next, the movement of the magnetron 12 will be described. As shown in the figures, the first transmission gear 4 is driven to rotate by the second driver 2t, which further drives the second transmission gear 6 engaged with the first transmission gear 4 to rotate, so that the hollow shaft 5 inside the second transmission gear 6 is driven to rotate. The hollow shaft 5 further drives the star gear 7 mounted thereon to rotate at a constant angular speed, so that the planet gear 8 engaged with the sun gear 7 is driven to rotate, i.e., the planet shaft 16 mounted inside the planet gear 8 is driven to rotate, and then the magnetron 12 is driven to move by the retractable link rod connected to the planet shaft 16, as the magnetron 12 is moveably provided on the peach-shaped track 14, and its movement is limited by the peach-shaped track 14, thus the magnetron 12 is controlled to move along the peach-shaped track 14. In summary, the magnetron 12 is driven to move by the second driver 2 along the peach-shaped track 14. On the other hand, as the planet shaft 16 is connected with the first shaft 3 via the planet rack 15, therefore, while the first driver 1 drives the peach-shaped track 14 to rotate around the axis of the first driving shaft 3, the planet shaft 16 is limited by the first driver 1 by means of the planet rack 15 to rotate around the axis of the first driving shaft 3 at the constant angular speed, and then the planet shaft 16 drives the magnetron 12 through the retractable link rod to move around the axis of the first driving shaft 3. In summary, on one hand, the magnetron 12 moves along the peach-shaped track 14 through the driving of the second driver 2, on the other hand, revolutes around the axis of the first driving shaft 3 through the driving of the first driver 1, such that the magnetron 12 can realize to scan the entire surface of the target material.

Therefore, the magnetron source according to the above embodiment of the invention, the second driver 2 can drive the magnetron 12 to move along the peach-shaped track 14 and the first driver 1 can drive the magnetron 12 to revolute around the axis of the first driving shaft 3, and the magnetron source with above transmission assembly is advantageous in stable structure, stable transmission, and simple operation, which enhance the practicability of the magnetron.

Figure 3:
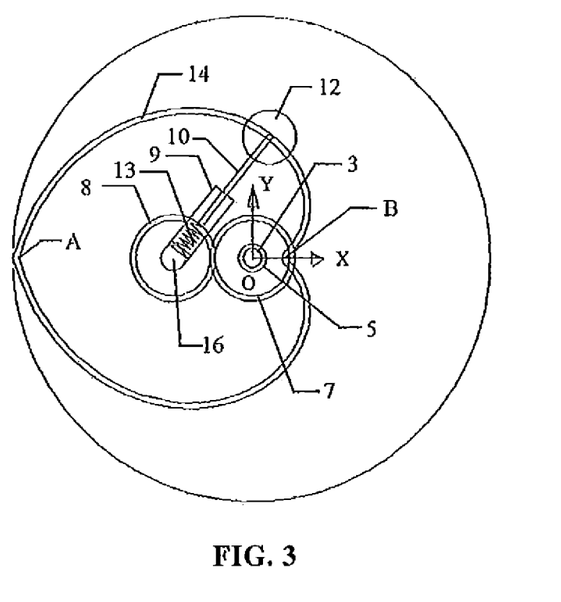
FIG. 3 is a polar coordinate schematic diagram of a peach-shaped track according to an embodiment of the invention.

In an embodiment according to the invention, the retractable link rod includes an inner rod 9 and an outer rod 10. Specifically, one end of the inner rod 9 is connected to the planet shaft 16. One end of the outer rod is connected to the magnetron 12 and the other end thereof is connected to the inner rod 9 via a retractable member 13. Optionally, as shown in FIG. 3, the other end of the inner rod 9 is provided with an axial hole, the other end of the outer rod 10 is inserted into the axial hole. The retractable member 13 is a spring provided in the axial hole so that the other end of the outer rod 10 is connected to the inner rod 9 via the spring. Thus, during the moving of the magnetron 12 along the peach-shaped track 14, the length of the retractable link rod may continuously change corresponding to the change in the distance from the planet gear 16 to the peach-shaped track 14, so as to ensure the magnetron 12 to move along the peach-shaped track 14.

In an embodiment according to the invention, the axis of the first driving shaft 3 passes through the center of the target material. Optionally, when the magnetron 12 is located on the tip of the peach-shaped track 14, the projection on the level surface of the outmost edge of the magnetron 12 (i.e., the edge with the furthest distance from the first driving shaft) is consistent with that of the periphery of the target material. Thus, it is ensured that the motion trajectory of the magnetron 12 can cover the entire target material, that is, the magnetron 12 can scan the entire surface of the target material. Preferably, as shown in FIG. 2, the peach-shaped track 14 is symmetrical with respect to X axis and portions of the peach-shaped track above the X axis are defined by following equation ⊗

$$r = a \times \theta + b$$

wherein the r is a distance from a point on the peach-shaped track to the origin of polar coordinates of the peach-shaped track, $\theta$ is a angle between the line segment connecting the point on the peach-shaped track to the origin of polar coordinates of the peach-shaped track and the forward direction of the X axis and $0 \leq \theta \leq \pi$, and both a and b are constants which are greater than zero and $a\pi+b$ equals to the radius of the target material. Please note that the so-called X axis is a symmetrical axis of the peach-shaped track, which is given for conveniently describing the equation, and should not be constructed to limit the movement of the peach-shaped track.

There is no specific limitation to the values of a and b, as long as satisfying the condition in which both a and b are constants which are greater than zero and $a\pi+b$ equals to the radius of the target material. Wherein, b indicates the distance from the origin of polar coordinates to the concave end B of the peach-shaped track, the motion trajectory of the magnetron 12 covering the entire surface of the target material can be ensured as long as b is greater than zero. The magnetron sputtering apparatus according to the present invention will be described below.

A magnetron sputtering apparatus according to an embodiment of the invention comprises a chamber body and a magnetron source. Wherein a chamber is defined in the chamber body. The magnetron source is a magnetron source according to any one of above embodiments, wherein a target material of the magnetron source is provided in the chamber body and the bottom surface of the magnetron source is exposed into the chamber. By the magnetron sputtering apparatus according to an embodiment of the invention, on one hand, the motion trajectory of the magnetron covering the entire surface of the target material can be ensured through the rotation of the peach-shaped track, on the other hand, the scanning time when the magnetron 12 scans the edge and center of the target material may be adjusted by adjusting the second driver 2 as needed. Therefore, by the magnetron sputtering apparatus according to an embodiment of the invention, the utilization ratio of the target material may be increased, an ideal bombardment effect may be realized with high metal ionization rate, and then an ideal sputtering effect in the sputtering process may be obtained.

Hereinafter, a magnetron sputtering method and the effect thereof will be described with reference to FIG. 4-FIG. 7.

The magnetron sputtering method according to an embodiment of the invention comprises: controlling the peach-shaped track 14 of the magnetron sputtering apparatus to rotate, and controlling the magnetron to move along the peach-shaped track 14 so as to bombard the target material, the motion trajectory of the magnetron 12 covering the entire surface of the target material can be ensured through controlling the rotation of the peach-shaped track 14 of the magnetron sputtering apparatus; by controlling speed of the magnetron 12 moving along the peach-shaped track 14, the utilization ratio of the center and edge of the target material may be increased, and then the utilization ratio of the whole target material may be increased, and an ideal bombardment effect may be realized, the metal ionization rate is high, and then an ideal sputtering effect in the sputtering process may be obtained.

In an embodiment of the invention, in one period in which the magnetron 12 runs a circle along the peach-shaped track 14 starting from the tip end A of the peach-shaped track 14, the magnetron 12 performs a first accelerated motion along the peach-shaped track in the first half period, and performs a first decelerated motion along the peach-shaped track 14 in the second half period.

Figure 4:
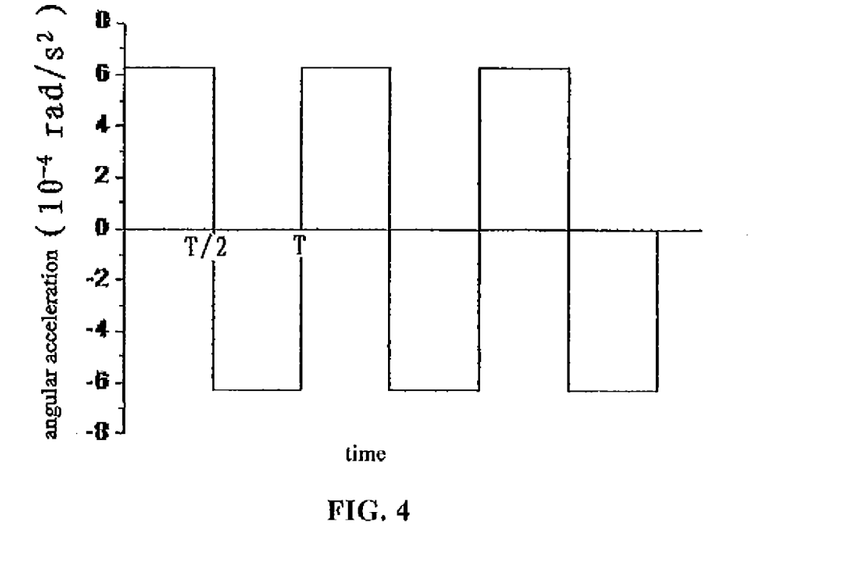
FIG. 4 shows a relationship between angular acceleration and time when the magnetron moves on the peach-shaped track in the magnetron sputtering method according to an embodiment of the invention.
Figure 5:
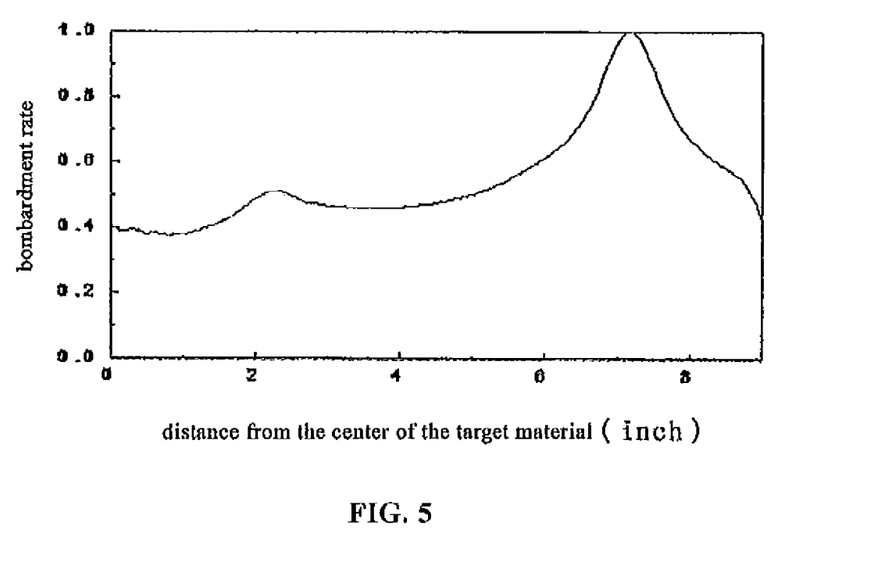
FIG. 5 is a curve of simulating target material bombardment wherein the magnetron is controlled to bombard the target material based on the relationship in FIG. 4.

In a preferable embodiment of the invention, as shown in FIG. 4, the magnetron 12 starts at a initial speed of 0 m/s from a initial position which is the tip end A of peach-shaped track 14, in the first half period (that is, 0~T/2), the magnetron 12 acceleratedly moves along the peach-shaped track 14 at an angular acceleration of $6.28 \times 10^{-4}$ rad/s$^2$: in the second half period (that is, T/2~T), the magnetron 12 decelerated moves along the peach-shaped track 14 at an angular acceleration of $-6.28 \times 10^{-4}$ rad/s$^2$. Accordingly, the magnetron 12 moves slowly at the edge of the target material, and moves fast at the center of the target material. Taking following specific target material and the peach-shaped track 14 as an example, in which the radius of the target material is 9.68 inch, the distance from the center of the magnetron 12 to the outmost edge thereof is 2.34 inch, the equation of the peach-shaped track 14 is $r = 1.97\theta + 1.15$ (in the unit of inch). That is, the distance from the origin of the polar coordinates of the peach-shaped track 14 to the concave end B of thereof is 1.15 inch, and the distance r from the origin of the polar coordinates to the tip end A of the peach-shaped track 14 is 7.34 inch (here θ lakes π, which is the maximum), when the magnetron 12 is at the tip end A of the peach-shaped track 14, the projection on the level surface of the outmost edge of the magnetron 12 is consistent with that of the periphery of the target material, that is, with the rotation of the peach-shaped track 14, the magnetron 12 may cover the entire surface of the target material. A target material etching curve shown in FIG. 5 may be obtained by simulating using above parameters of the target material and the peach-shaped track 14. It can be known from FIG. 5, the target material is bombarded deeply near the edge thereof, and the center thereof is also bombarded to some extent (about 40%). It can be concluded by calculating areas that the utilization ratio of the target material is 62%.

In another preferable embodiment of the invention, in one period in which the magnetron 12 runs a circle along the peach-shaped track 14 from the tip end A of the peach-shaped track 14, the magnetron 12 performs in turn a first accelerated motion, a first uniform motion, a second accelerated motion, a first decelerated motion, a second uniform motion, and a second decelerated motion. Preferably, the moving limes of the first accelerated motion, the first uniform motion, the second accelerated motion, the first decelerated motion, the second uniform motion, and the second decelerated motion are equal to each other.

Figure 6:
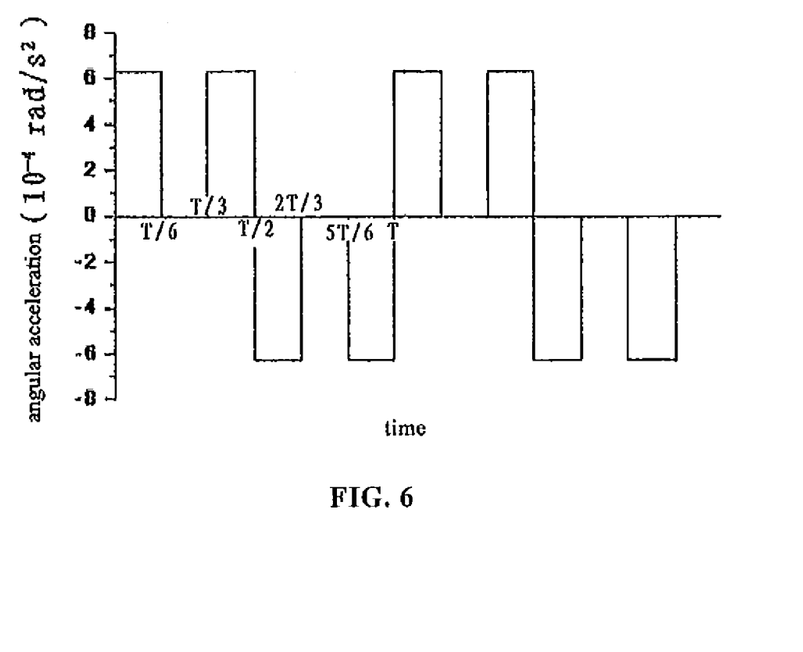
FIG. 6 shows a relationship between angular acceleration and time when the magnetron moves on the peach-shaped track in the magnetron sputtering method according to another embodiment of the invention.
Figure 7:
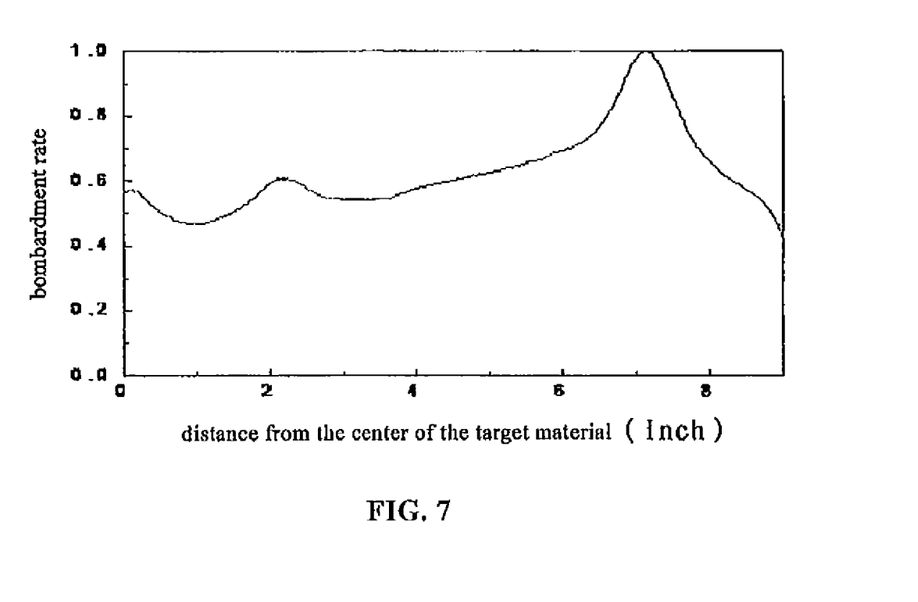
FIG. 7 is a curve of simulating target material bombardment wherein the magnetron is controlled to bombard the target material based on the relationship in FIG. 6.

In a preferable embodiment of the invention, as shown in FIG. 6, the magnetron 12 starts at an initial speed of 0 m/s from an initial position which is the lip end A of peach-shaped track 14, the magnetron 12 performs the first accelerated motion in a first one-sixth period (that is, $0 \sim T/6$), the first uniform motion in a second one-sixth period (that is, $T/6 \sim T/3$), the second accelerated motion in a third one-sixth period (that is, $T/3 \sim T/2$), the first decelerated motion in a forth one-sixth period (that is, $T/2 \sim 2T/3$), the second uniform motion in a fifth one-sixth period (that is, $2T/3 \sim 5T/6$), and the second decelerated motion in a sixth one-sixth period (that is, $5T/6 \sim T$). The angular accelerations in the first accelerated motion and the second accelerated motion are $6.28 \times 10^{-4}$ rad/s$^2$, and the angular accelerations in the first decelerated motion and the second decelerated motion are $-6.28 \times 10^{-4}$ rad/s$^2$. With these motions, the magnetron 12 can move slowly at the edge of the target material, and moves fast at the center of the target material. As such, taking following specific target material and the peach-shaped track 14 as an example, in which the radius of the target material is 9.68 inch, the distance from the center of the magnetron 12 to the outmost edge thereof is 2.34 inch, the equation for the peach-shaped track 14 is $r=1.97θ+1.15$ (in the unit of inch), and a target material etching curve shown in FIG. 7 may be obtained by simulation. It can be known from FIG. 7, compared with above embodiment, the bombardment rate at the center area of the target material is further increased, that is, from about 40% to more than 50%. As such, the bombardment at edge of the target material is maximum, which reaches an ideal bombardment effect (i.e., the utilization ratio at the edge of the target material is desirable), and the utilization ratio of the entire target material is further raised up to 67%.

It should be noted, the radius of the target material, the size of the magnetron 12 and the track equation for the peach-shaped track 14 in above embodiment just exemplary, and in practice, it can be designed as needed.

In the description, the terms of "an embodiment", "some embodiments", "example", "specific example", or "some examples" mean that specific features, structures, materials or characters described in combining said embodiment or example are included in at least one of embodiments or examples of the invention. In the description, the schematic representations of above terms need not refer to the same embodiment or example. Also, the described specific features, structures, materials or characters may be combined in appropriate manner in any one or more embodiments or examples.

While embodiments of the invention has been illustrated and described, it should be appreciated by persons skilled in the art that many modifications, variations, substitutions and changes may be made without departing from the scope and principle of the present invention, the scope of the invention is limited by the claims and their equivalents.

What is claimed is:

1. A magnetron source, characterized by comprising:
   a target material;
   a magnetron located above the target material; and
   a scanning mechanism connected to the magnetron for controlling the movement of magnetron above the target material, wherein the scanning mechanism comprises:
   a peach-shaped track, with the magnetron movably disposed thereon;
   a first driving shaft, with the bottom end thereof connected with the origin of polar coordinates of the peach-shaped track, for driving the peach-shaped track to rotate around the axis of the first driving shaft;
   a first driver connected to the first driving shaft, for driving the first driving shaft to rotate; and
   a second driver for driving the magnetron to move along the peach-shaped track via a transmission assembly.

2. The magnetron source according to claim 1, characterized in that, the transmission assembly comprises:
   a first transmission gear connected with the second driver and is driven by the second driver;
   a hollow shaft and a second gear, the said hollow shaft is rotatably nested outside the first driving shaft, and the said second gear is mounted on the hollow shaft and engaged with the first transmission gear;
   a star gear mounted to or on the said hollow shaft;
   a planet shaft and a planet gear, the said planet gear is mounted to the said planet shaft and engaged with the said planet gear to drive the said planet shaft to rotate;
   a retractable link rod, one end thereof is connected to the said planet shaft and the other end thereof is connected to the said magnetron for driving the said magnetron to move along the said peach-shaped track; and
   a star rack, one end thereof is fixed to the said first driving shaft and the said planet shaft is rotatably mounted to the other end thereof.

3. The magnetron source according to claim 2, characterized in that, the said retractable link rod comprises:
   an inner rod with one end thereof connected to the said planet shaft; and
   an outer rod with one end thereof connected to the magnetron and the other end thereof connected to the inner rod via a retractable member.

4. The magnetron source according to claim 3, characterized in that, the other end of the inner rod is provided with an axial hole, into which the other end of the outer rod is inserted, the retractable member is a spring provided in the axial hole so that the other end of the outer rod is connected to the inner rod via the spring.

5. The magnetron source according to claim 1, characterized in that, the axis of the first driving shaft passes through the center of the target material.

6. The magnetron source according to claim 5, characterized in that, when the magnetron is located on the tip of the peach-shaped track, the projection on the level surface of the outmost edge of the magnetron is consistent with that of the periphery of the target material.

7. The magnetron source according to claim 6, characterized in that, the said peach-shaped track is symmetrical with respect to X axis and portions of the peach-shaped track above the X axis are defined by following equation:

$$r = a \times \theta + b$$

wherein the r is a distance from a point on the peach-shaped track to the origin of polar coordinates of the peach-shaped track, θ is an angle between the line segment connecting the point on the peach-shaped track to the origin of polar coordinates of the peach-shaped track and the forward direction of the X axis and $0 \leq \theta \leq \pi$, and both a and b are constants which are greater than zero.

8. The magnetron source according to claim 1, characterized in that, the first driver and the second driver are motors.

9. A magnetron sputtering apparatus, characterized by comprising:
a chamber body in which a chamber is defined; and
a magnetron source having a target material, the target material of the magnetron source being provided on an upper end of the chamber body and a lower surface of the magnetron source is exposed into the chamber body, the magnetron source being located above the target material; and a scanning mechanism connected to the magnetron for controlling the movement of magnetron above the target material, the scanning mechanism having a peach-shaped track, with the magnetron movably disposed thereon; a first driving shaft, with the bottom end thereof connected with the origin of polar coordinates of the peach-shaped track, for driving the peach-shaped track to rotate around the axis of the first driving shaft; a first driver connected to the first driving shaft, for driving the first driving shaft to rotate; and a second driver for driving the magnetron to move along the peach-shaped track via transmission assembly.

10. A magnetron sputtering method, characterized by comprising:
a magnetron sputtering apparatus comprises a chamber body in which a chamber is defined; and a magnetron source having a target material, the target material of the magnetron source being provided on an upper end of the chamber body and a lower surface of the magnetron source is exposed into the chamber body, the magnetron source being located above the target material; and a scanning mechanism connected to the magnetron for controlling the movement of magnetron above the target material, the scanning mechanism having a peach-shaped track, with the magnetron movably disposed thereon; a first driving shaft, with the bottom end thereof connected with the origin of polar coordinates of the peach-shaped track, for driving the peach-shaped track to rotate around the axis of the first driving shaft; a first driver connected to the first driving shaft, for driving the first driving shaft to rotate; and a second driver for driving the magnetron to move along the peach-shaped track via transmission assembly; and
controlling the peach-shaped track of the magnetron sputtering apparatus to rotate, and controlling the magnetron to move along the peach-shaped track so as to bombard the target material.

11. The magnetron sputtering method according to claim 10, characterized in that, in one period in which the magnetron runs a circle along the peach-shaped track from the tip end of the peach-shaped track, the magnetron accelerates along the peach-shaped track in the first half period, and decelerates along the peach-shaped track in the second half period.

12. The magnetron sputtering method according to claim 11, characterized in that, the angular acceleration when the magnetron accelerates is $6.28 \times 10^{-4}$ rad/s$^2$, and the angular acceleration when the magnetron decelerates is $-6.28 \times 10^{-4}$ rad/s$^2$.

13. The magnetron sputtering method according to claim 10, characterized in that, in one period in which the magnetron runs a circle along the peach-shaped track from the tip end of the peach-shaped track, the magnetron performs in turn a first accelerated motion, a first uniform motion, a second accelerated motion, a first decelerated motion, a second uniform motion, and a second decelerated motion.

14. The magnetron sputtering method according to claim 13, characterized in that, the running times of the first accelerated motion, the first uniform motion, the second accelerated motion, the first decelerated motion, the second uniform motion, and the second decelerated motion are equal to each other.

15. The magnetron sputtering method according to claim 13, characterized in that, the angular accelerations in the first accelerated motion and the second accelerated motion are $6.28 \times 10^{-4}$ rad/s$^2$, and the angular acceleration in the first decelerated motion and the second decelerated motion are $-6.28 \times 10^{-4}$ rad/s$^2$.

16. The magnetron sputtering apparatus according to claim 9, characterized in that, the transmission assembly comprises:
a first transmission gear connected with the second driver and is driven by the second driver;
a hollow shaft and a second gear, the said hollow shaft is rotatably nested outside the first driving shaft, and the said second gear is mounted on the hollow shaft and engaged with the first gear;
a star gear mounted to or on the said hollow shaft;
a planet shaft and a planet gear, the said planet gear is mounted to the said planet shaft and engaged with the said planet gear to drive the said planet shaft to rotate;
a retractable link rod, one end thereof is connected to the said planet shaft and the other end thereof is connected to the said magnetron for driving the said magnetron to move along the said peach-shaped track; and
a star rack, one end thereof is fixed to the said first driving shaft and the said planet shaft is rotatably mounted to the other end thereof.

17. The magnetron sputtering apparatus according to claim 16, characterized in that, the said retractable link rod comprising:
an inner rod with one end thereof connected to the said planet shaft; and
an outer rod with one end thereof connected to the magnetron and the other end thereof connected to the inner rod via a retractable member.

18. The magnetron sputtering apparatus according to claim 17, characterized in that, the other end of the inner rod is provided with an axial hole, into which the other end of the outer rod is inserted, the retractable member is a spring provided in the axial hole so that the other end of the outer rod is connected to the inner rod via the spring.

19. The magnetron sputtering apparatus according to claim 9, characterized in that, the axis of the first driving shaft passes through the center of the target material.

20. The magnetron sputtering apparatus according to claim 9, characterized in that, when the magnetron is located on the tip of the peach-shaped track, the projection on the level surface of the outmost edge of the magnetron is consistent with that of the periphery of the target material.

* * * * *